United States Patent
Gotoh et al.

(10) Patent No.: US 7,883,614 B2
(45) Date of Patent: Feb. 8, 2011

(54) METHOD OF MANUFACTURING ELECTRONIC PART AND ELECTRONIC PART

(75) Inventors: Masashi Gotoh, Tokyo (JP); Hajime Kuwajima, Tokyo (JP); Hiroki Hara, Tokyo (JP); Hiroshi Yamamoto, Tokyo (JP)

(73) Assignee: TDK Corporation, Tokyo (JP)

( * ) Notice: Subject to any disclaimer, the term of this patent is extended or adjusted under 35 U.S.C. 154(b) by 1128 days.

(21) Appl. No.: 10/560,528

(22) PCT Filed: Jun. 8, 2004

(86) PCT No.: PCT/JP2004/008301
§ 371 (c)(1),
(2), (4) Date: Dec. 13, 2005

(87) PCT Pub. No.: WO2005/002304
PCT Pub. Date: Jan. 6, 2005

(65) Prior Publication Data
US 2009/0220683 A1   Sep. 3, 2009

(30) Foreign Application Priority Data
Jun. 30, 2003   (JP) .............................. 2003-186226

(51) Int. Cl.
*H05K 3/00*   (2006.01)
*C25D 5/00*   (2006.01)

(52) U.S. Cl. .................. 205/80; 205/125; 205/126; 205/131; 427/58; 427/61; 427/96.1

(58) Field of Classification Search .................. 205/125, 205/126, 80, 131; 427/61, 96.1, 58
See application file for complete search history.

(56) References Cited

U.S. PATENT DOCUMENTS

| | | | |
|---|---|---|---|
| 5,151,168 A * | 9/1992 | Gilton et al. ................. | 205/123 |
| 5,972,192 A * | 10/1999 | Dubin et al. ................. | 205/101 |
| 6,319,831 B1 * | 11/2001 | Tsai et al. ................... | 438/678 |
| 6,370,768 B1 | 4/2002 | Itabashi | |
| 2001/0054558 A1 * | 12/2001 | Tada et al. ................... | 205/123 |
| 2002/0084192 A1 * | 7/2002 | Maydan et al. ............. | 205/170 |

FOREIGN PATENT DOCUMENTS

| | | |
|---|---|---|
| JP | 05-335713 | 12/1993 |
| JP | 11-103171 | 4/1999 |
| JP | 11-343593 | 12/1999 |
| JP | 2001-217553 | 8/2001 |
| JP | 2003-110211 | 4/2003 |

* cited by examiner

*Primary Examiner*—Shamim Ahmed
(74) *Attorney, Agent, or Firm*—Oblon, Spivak, McClelland, Maier & Neustadt, L.L.P.

(57) ABSTRACT

The method for manufacturing an electronic part includes a step of forming an opening hole onto an insulating member sandwiched between a conductor film and a lower conductor layer, from the conductor film, a step of making a surface of the lower conductor layer adhering the insulating member as bottom of the opening hole, and making a metal plating as a conductor portion grow in the opening hole from the lower conductor layer. In the method, after metal plating has reached the conductor film, the metal plating is grown on the conductor film and the conductor portion as electrode, to thereby form a thickness enough to form an upper conductive layer.

6 Claims, 7 Drawing Sheets

METHOD OF MANUFACTURING ELECTRONIC PART AND ELECTRONIC PART

BACKGROUND OF THE INVENTION

1. Field of the Invention

This invention relates to a method of manufacturing an electronic part comprising a plurality of single-layer plates laminated in succession, and an electronic part, and particularly to a method of manufacturing an electronic part suitable for forming an electrical conductor for effecting connection between adjacent ones of the single-layer plates, and an electronic part.

2. Related Background Art

There is known such an electronic part as forms a conductor portion extending through single-layer plates, and superposes these one upon another to thereby effect connection between the single-layer plates.

In the single-layer plates, there have heretofore been proposed and disclosed various manufacturing methods for forming a conductor portion for effecting the connection between layers. FIGS. 6A to 6D of the accompanying drawings are step illustrations showing the conventional manufacturing process of the single-layer plate of an electronic part.

In a single-layer plate constituting an electronic part, as shown in FIG. 6A, there are formed in advance a base member 1 formed of an insulating material having a predetermined thickness, and conductor film 2 and a lower conductor layer 3 formed on the opposite sides of the base member 1.

To form an upper wiring pattern 4 and a lower wiring pattern 5 (see FIG. 7C of the accompanying drawings) on the opposite sides of the single-layer plate of such a form, dry film 6 providing resist is first attached so as to cover the conductor film 2. After the dry film 6 has been attached, exposure and development are effected to thereby form an aperture 7 corresponding to the diameter of a conductor portion which will be described later. After the aperture 7 has been thus formed in the dry film 6, as shown in FIG. 6B, etching is effected on the conductor film 2 exposed on the bottom surface of the aperture 7 to thereby remove the exposed conductor film 2 from the aperture 7 and expose the base member 1.

After the base member 1 has been thus exposed on the bottom of the aperture 7 by the etching process, as shown in FIG. 6C, the dry film 6 is peeled off and also, an opening portion 8 corresponding to the diameter of the aperture 7 is formed by laser irradiation. After the opening portion 8 has been thus formed, as shown in FIG. 6D, electroless plating which is chemical plating is uniformly effected on the upper layer side and opening portion 8 of the base member 1 to thereby form an electroless plating layer 9.

After the electroless plating layer 9 has been formed, electroplating is effected with the electroless plating layer 9 as electric power supplying film (electrode) to thereby precipitate a metal 10 in the interior of the opening portion 8 and on the upper side of the conductor film 2. This state is shown in FIG. 7A of the accompanying drawings. As shown in FIG. 7B of the accompanying drawings, the interior of the opening portion 8 is then filled with the metal 10 by electroplating whereafter as shown in FIG. 7C, patterning is effected on the conductor film 2 and the lower conductor layer 3 by a subtractive method, to thereby form the upper wiring pattern 4 and the lower wiring pattern 5 and also, form a conductor portion 11 in the opening portion 8.

Now, in the foregoing conventional example, an electroless plating layer has been used to contrive an improvement in the close contact between the base member and the conductor portion 10 (see, for example, Japanese Patent Application Laid-open No. H11-343593), but there is also known a method of applying other processing in place of the electroless plating layer (see, for example, Japanese Patent Application Laid-open No. 2001-217553).

However, the use of the above-described electroless plating (and other method replacing the electroless plating) has posed such a problem as shown below.

That is, if as shown in FIG. 7B, an attempt is made to effect electroplating to thereby fill the opening portion 8 with the metal 10 after the electroless plating layer has been formed, there has been the problem that a plating layer is thickly formed on the whole of one side of the base member and as the result, when as shown in FIG. 7C, wiring patterns are to be formed by etching, the cross sections of the wiring patterns become trapezoid, and dimensional accuracy is reduced and wiring patterns of a narrow width cannot be formed.

Also, when the electroless plating layer 9 is formed and electroplating is effected with this as an electrode, fresh plating liquid is more applied to the surface of the electroless plating layer 9 than to the inside of the aperture. Therefore, the growth of the electroplating layer on this surface is promoted and as the result, there has been the possibility that before the opening portion 8 is filled with the metal material, the opening portion 8 is closed (by the electroplating layer) and a so-called void forms in the interior of the conductor portion 3.

Also, there has been the possibility that a similar problem arises when the electroless plating is not used, but other ante-processing is effected.

Now, when electroless plating is used, a metal catalyst is used to cause plating to adhere also to other portion (insulator portion) than a conductor. However, if this metal catalyst is residual on the surface of a wiring layer, there has been the possibility that an insulation resistance value is reduced or an obstruction such as the short-circuiting of the wiring pattern is caused. In the electronic parts in recent years, a narrower pitch is advanced and the possibility of the above-noted obstruction has become higher.

SUMMARY OF THE INVENTION

In view of the above-noted problems peculiar to the prior art, the present invention has as its object to provide a method of manufacturing an electronic part which can disuse electroless plating which is the ante-processing of electroplating, or other ante-processing corresponding thereto to thereby achieve the simplification of the process and also, achieve an improvement in electrical reliability, and an electronic part.

The present invention has been made on the basis of the finding that if electroplating is grown with a conductor layer providing the surface of an opening portion and attached to one side of a single-layer plate as electric supplying film (electrode), a conductor portion can be formed without an electroless plating layer being used as an electrode.

That is, the method of manufacturing an electronic part according to the present invention is a method of manufacturing an electronic part in which on that side of an insulating member sandwiched between conductor film and a lower conductor layer which is adjacent to the conductor film, a conductor portion connected from the lower conductor layer is exposed, comprising forming an opening portion having the lower conductor layer as a bottom in the formed area of the conductor portion from the conductor film side, growing metal plating from the bottom of the opening portion with the lower conductor layer as an electrode, growing metal plating on the upper surfaces of the conductor film and the conductor portion with the conductor film and the conductor portion as electrodes after the metal plating has reached the conductor film to thereby form the conductor portion in the opening portion, and forming a thickness enough to form an upper conductor layer.

More specifically, the method according to the present invention is a method of manufacturing an electronic part in which on the upper surface of an insulating member covering a lower conductor layer, a conductor portion connected from the lower conductor layer is exposed, comprising forming conductor film on the upper surface of the insulating member and protective film on a portion of the conductor film in a thickness direction, and thereafter forming an opening portion having the lower conductor layer as a bottom in the protective film and the conductor film in the formed area of the conductor portion, growing metal plating from the bottom of the opening portion with the lower conductor layer as an electrode, and growing metal plating on the upper surfaces of the conductor film and the conductor portion with the exposed conductor film and the conductor portion on which protective film is not formed as electrodes, to thereby form a thickness enough to form an upper conductor layer after the metal plating has reached the conductor film to thereby form the conductor portion in the opening portion.

Design may be made such that the exposed conductor film providing the electrode is set outside a product area or making the insulating member and the conductor film are made into a unit in advance, and this unit is used.

The electronic part according to the present invention is an electronic part having structure in which an upper conductor layer is formed on the upper side of an insulating member covering a lower conductor layer and also, the lower conductor layer and the upper conductor layer are connected together by a conductor portion extending through the insulating member, wherein the conductor portion providing the connection between the lower conductor layer and the upper conductor layer and an upper constant thickness in the upper conductor layer are formed by only the precipitation of a metal by electroplating.

According to the above-described construction, an etching process is first carried out from above the insulating member in which electric power supplying film and resist (dry film) are laminated. After the etching process has been carried out, the exposed insulating member is subjected to blast processing or laser working to thereby remove the insulating member corresponding to a conductor portion forming area, and the lower conductor layer underlying this insulating member is exposed to thereby form an opening portion. Instead of carrying out the etching process, laser working may be applied. When the laser working is applied, it is popular that YAG laser (yttrium aluminum garnet laser) is used for the above-described working to the conductor layer, a carbonic acid gas laser is used for the working to the insulating member formed of insulating resin. These different lasers can be carried on one and the same positioning mechanism from the standpoint of improving working efficiency to thereby effect continuous working (of the conductor layer and the insulating member).

After the opening portion has been thus formed, electroplating is effected with the lower conductor layer as an electrode, whereupon a metal precipitated by the plating grows from the lowermost position of the opening portion, i.e., the lower conductor layer. When the growth of the metal plating starting from the lower conductor layer continues, the inside of the opening portion is filled with the metal plating and a conductor portion is formed. When here, the conductor portion grows and reaches conductor film located on the upper surface of the insulating member, the area of the electrode increases from the area of the conductor portion to the area of the conductor portion plus the conductor film, and the current density per unit area in the electrode lowers greatly. Therefore, the conductor portion is electrically connected to the conductor film, whereby this can become the stopper of the growth of the conductor portion.

By the stopper action due to this increase in the area of the electrode, the following effect can be obtained.

If the inner diameter of the opening portion in the insulating member is uneven, unless the conductor film is used as the stopper, the volume of the plating which fills the opening portion also becomes uneven in conformity with the unevenness of the volume in the opening portion, and finally affects the unevenness of the height of the plating. The degree of this unevenness becomes more remarkable as the current density for the precipitation of the plating is higher.

However, if the conductor film is used as the stopper, even if the unevenness of volume exists among a plurality of opening portions, the area of the electrode will increase from a point of time at which the conductor portion has conducted to the conductor film, and along therewith, the current density will lower greatly. Therefore, the precipitation speed of the plating will be lowered, and even if the volume of the opening portion is uneven, it becomes possible to suppress the influence thereof upon the height of the plating.

Now, in a case where the conductor portion conducts to the conductor film, the conductor portion and the conductor film provide electrodes as previously described and therefore, the film thicknesses of the conductor portion and the conductor film are increased, and a film thickness necessary for a wiring pattern (i.e., the thickness of the upper conductor layer) can be secured by time control or the like. Further, the conductor portion formed in the opening portion has its cross-sectional shape made into a substantially T-shape closely adhering with the upper conductor layer and therefore is improved in joint strength, and the inconvenience that the conductor portion is peeled off from the opening portion by an extraneous force can be prevented.

While in the above-described construction, for the convenience of construction, use has been made of the lower conductor layer and the conductor portion overlying this lower conductor layer, this upper and lower positional relationship is not restrictive, but of course, an electronic part manufactured by the above-described process may be used in such a manner that the conductor portion is the lower side and the lower conductor layer overlies the conductor portion.

DESCRIPTION OF THE PREFERRED EMBODIMENT

Figure 1:
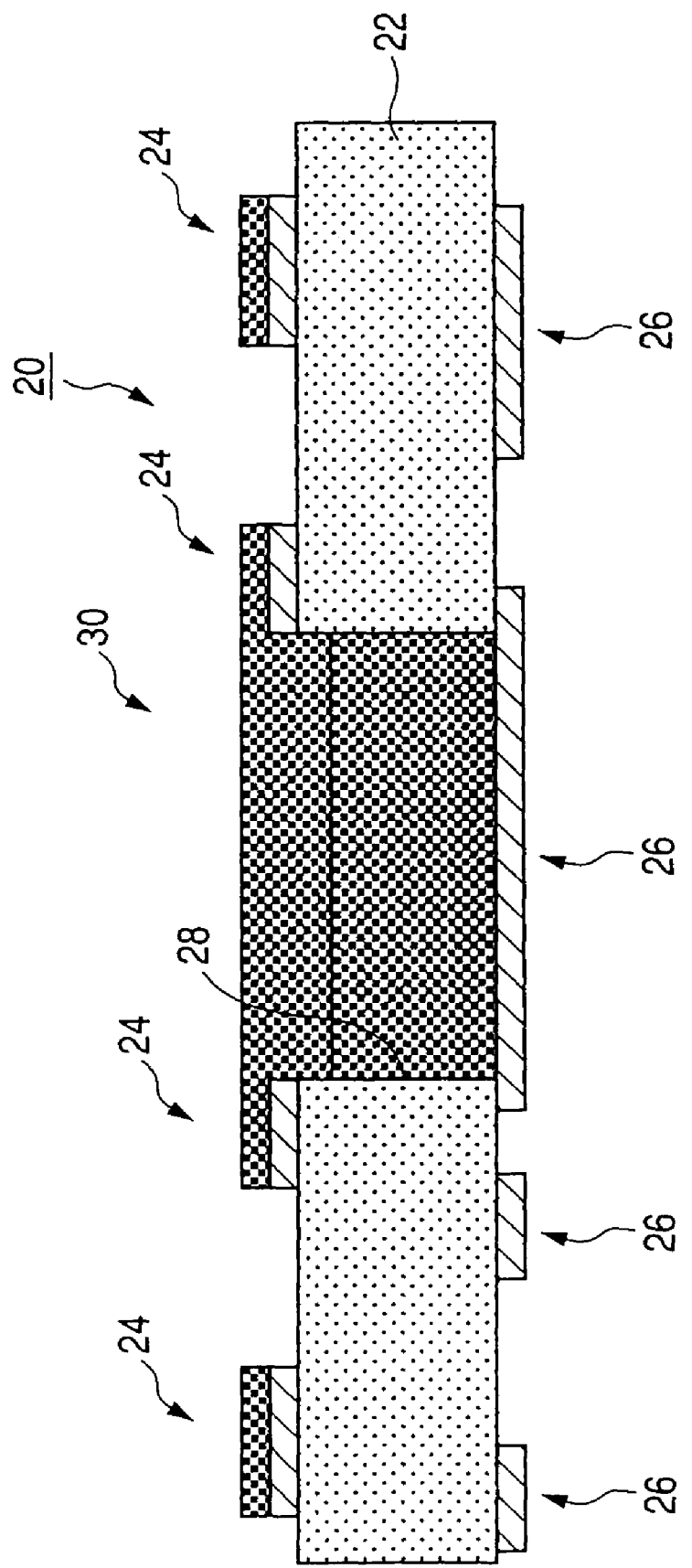
FIG. 1 is a cross-sectional view of the essential portions of a single-layer plate having a conductor portion formed therein.

A method of manufacturing an electronic part, and an electronic part will hereinafter be described in detail with respect to a preferred specific embodiment thereof shown in the drawings.

An electronic part according to the present embodiment is of a form in which wiring patterns are laminated on the opposite sides of a single-layer plate. A plurality of such single-layer plates are laminated to thereby form stereoscopic wiring structure between the single-layer plates.

Figure 2:
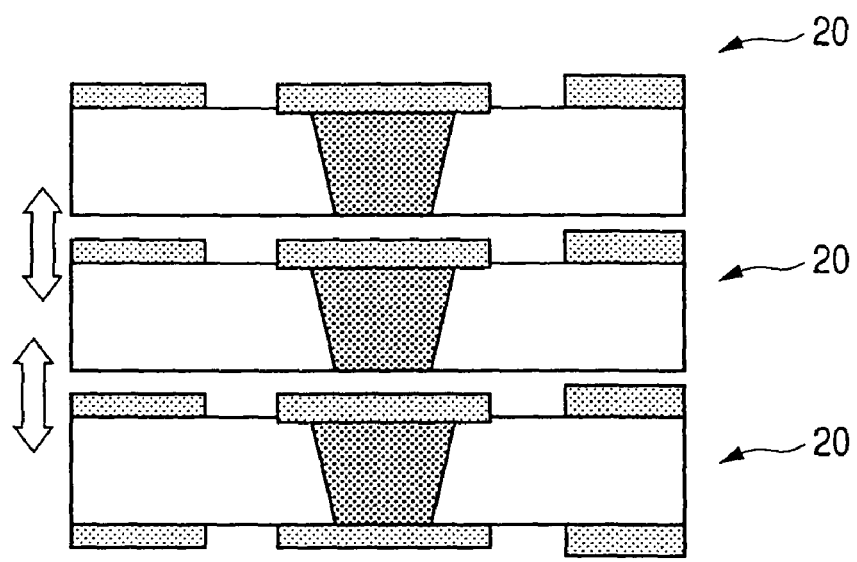
FIG. 2 is an illustration showing the construction of an electronic part comprising a plurality of single-layer plates shown in FIG. 1 laminated.
Figure 2:
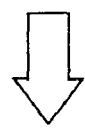
Figure 2:
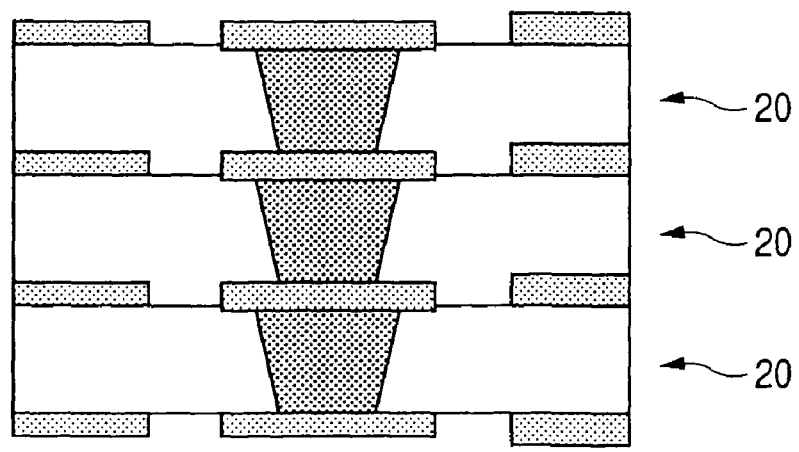

FIG. 1 is a cross-sectional view of the essential portions of a single-layer plate having a conductor portion formed therein, and FIG. 2 is an illustration showing the construction of an electronic part comprising a plurality of single-layer plates shown in FIG. 1 laminated.

As shown in these figures, the single-layer plate 20 constituting the electronic part according to the present embodiment has a base member 22 comprising an insulating member having a predetermined thickness, an upper wiring pattern 24 formed on the upper surface of this base member 22, and a lower wiring pattern 26 formed on the back side of the base member 22.

In the above-described base member 22, an opening portion 28 having the lower wiring pattern 26 as a bottom surface is formed so as to extend through the base member 22, and a conductor portion 30 precipitated by electroplating is formed in the opening portion. This conductor portion 30 has its cross section enlarged in diameter into a T-shape on the upper wiring pattern 24 side so that a thickness necessary for the upper wiring pattern 24 may be secured by this enlarged diameter portion. Because the conductor portion 30 has its cross section formed into a T-shape, end portions larger in diameter than the opening portion 28 are formed on the opposite ends of the base member 22, and even if an extraneous force is applied to the single-layer plate 20, the inconvenience that the conductor portion 30 comes off from the opening portion 28 can be prevented.

Now, the above-described conductor portion 30 was formed by only electroplating without ante-processing such as, for example, electroless plating being carried out. Therefore, in the single-layer plate 20 manufactured by the manufacturing method according to the present embodiment, the ante-processing step such as electroless plating becomes unnecessary when the conductor portion 30 is to be formed and thus, the shortening of the manufacturing process is achieved. Further, by the aforementioned ante-processing step being made unnecessary, for example, a metal catalyst used to improve the reaction speed of the electroless plating process can be prevented from being residual on the wiring pattern side, and it becomes possible to improve the reliability of the electronic part.

A method of manufacturing the electronic part having such a feature will be shown below.

FIGS. 3A to 3D and FIGS. 4A to 4D are process illustrations showing the procedure of forming a conductor portion in a single-layer plate.

Figure 3A:
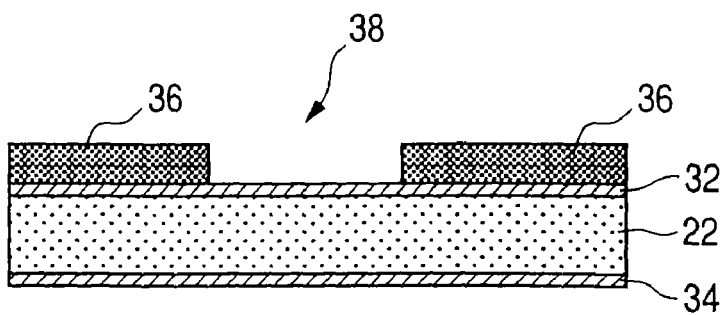
FIGS. 3A, 3B, 3C and 3D are process illustrations showing the procedure of forming a conductor portion in a single-layer plate.

To form the conductor portion 30 so as to extend through the single-layer plate 20, in the base member 22 having conductor layers (conductor film 32 and a lower conductor layer 34) formed on the opposite sides thereof, as shown in FIG. 3A, dry film (resist) 36 providing protective film is first attached so as to cover the conductor film 32. After this dry film 36 has been attached, photoetching is effected on this dry film 36 to thereby form an aperture 38 corresponding to the aforedescribed opening portion 28.

Figure 3B:
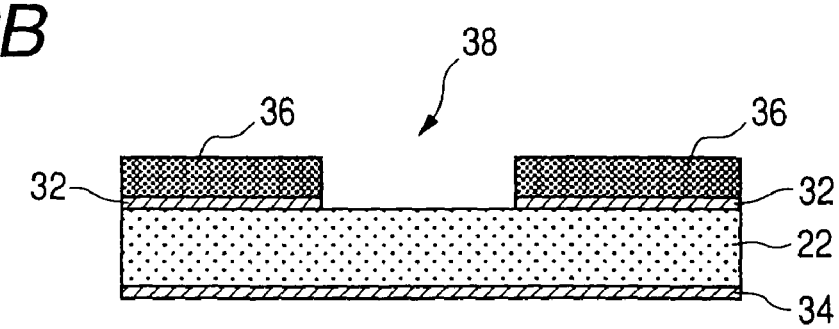

After the aperture 38 corresponding to the diameter of the opening portion 28 has been thus formed in the dry film 36, etching is effected on the conductor film 32 exposed under the dry film 36 to thereby remove the conductor film 32. FIG. 3B shows the state after the conductor film 32 has been removed by etching.

Figure 3C:
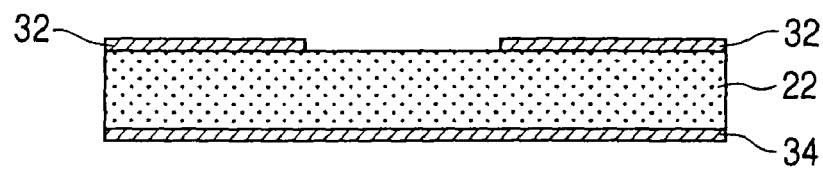
Figure 3D:
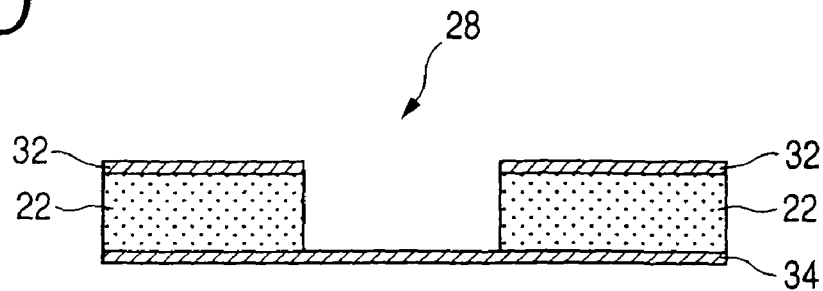

After the lower conductor layer 34 has been removed by the etching to thereby expose the surface of the base member 22, the dry film 36 is removed from the conductor film 32 side as shown in FIG. 3C, whereafter the base member 22 exposed on the bottom of the aperture 38 is removed by laser irradiation to thereby form the opening portion 28 in which the lower conductor layer 34 is exposed on the bottom surface. FIG. 3D shows the cross-sectional shape after this opening portion 28 has been formed.

Figure 4A:
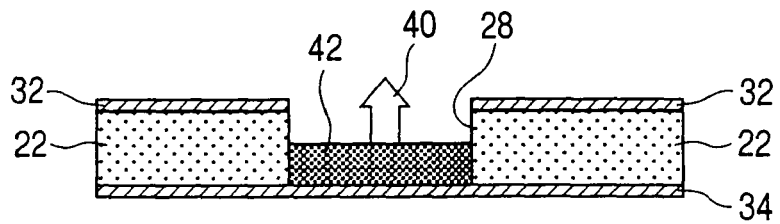
FIGS. 4A, 4B, 4C and 4D are process illustrations showing the procedure of forming a conductor portion in a single-layer plate.
Figure 4B:
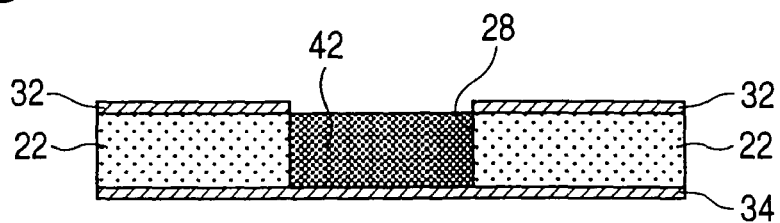

After the opening portion 28 has been formed, electroplating is effected with the lower conductor layer 34 as electric power supplying film (electrode). If electroplating is thus effected with the lower conductor layer 34 as the electric power supplying film, a metal 42 is precipitated in the direction of arrow 40 in FIG. 4A. When a predetermined time elapses, the metal 42 in the opening portion 28 grows, and reaches the conductor film 32. FIG. 4B shows a state in which the metal 42 has reached the conductor film 32 (i.e., a state in which electrical conduction has been achieved).

Figure 4C:
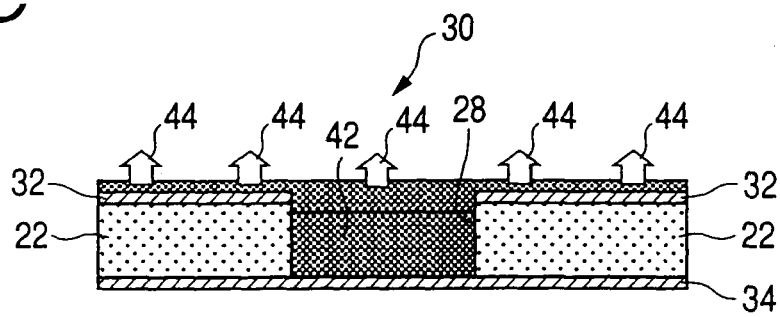

When the metal 42 thus reaches the conductor film 32, not only the metal 42 in the opening portion 28 but also the conductor film 32 act as electrodes and therefore, the film thickness of the entire conductor film 32 increases as indicated by arrows 44 in FIG. 4C. When the metal 42 grows and reaches the conductor film 32, the area of the electric power supplying film providing an electrode increases from an area corresponding to the diameter of the opening portion 28 to that area plus the conductor film 32, whereby the current density per unit area in the electrode can be reduced greatly. Therefore, the conductor portion is electrically connected to the conductor film, whereby it can become a stopper for the growth of the conductor portion and also, even if there is the unevenness of diameter between adjacent opening portions, it becomes possible to suppress the precipitation speed to thereby suppress the unevenness in the height direction.

Figure 4D:
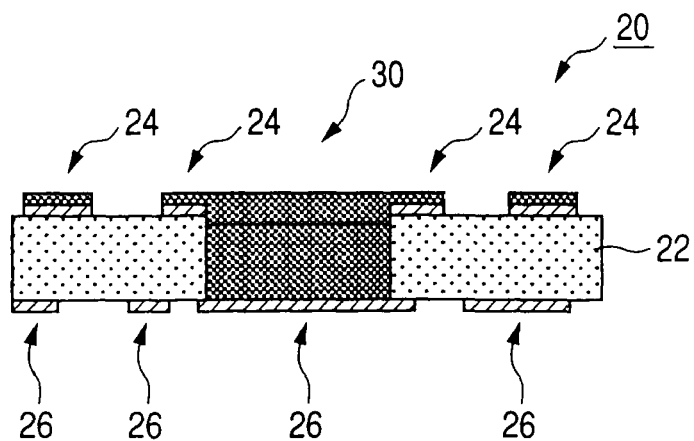

After with the lapse of time, the film thickness formed above the conductor film 32 has reached a preset film thickness (i.e., the preset thickness of the upper conductor layer), the patterning of the upper conductor layer and the lower conductor layer 34 is effected by a subtractive method or a semi-additive process, and an upper wiring pattern 24 and a lower wiring pattern 26 are formed from these conductor layers. FIG. 4D shows a state in which a conductor portion 30 extending through the base member 22, and the upper wiring pattern 24 and the lower wiring pattern 26 have been formed.

Figure 5:
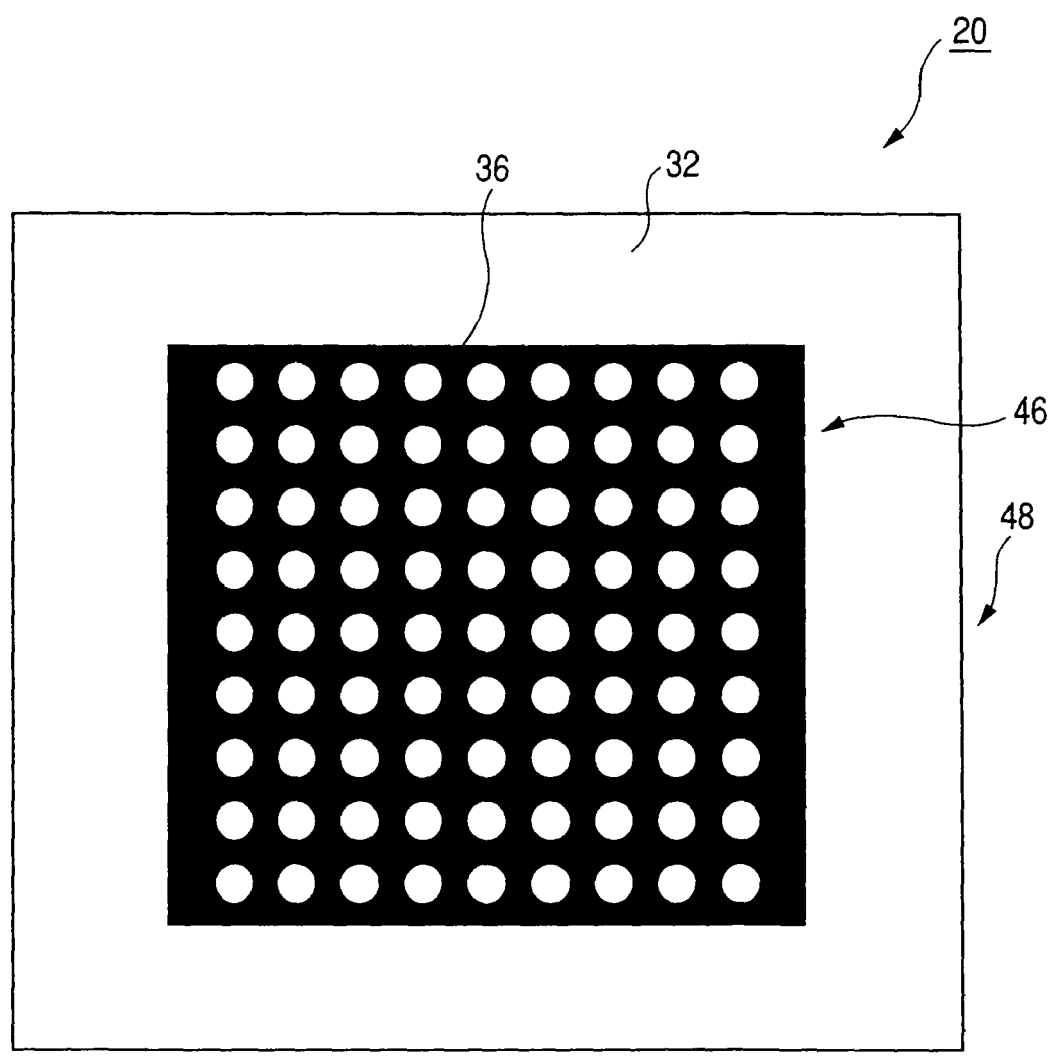
FIG. 5 is an illustration showing the positional relationship between a product forming area and an area outside the product.
Figure 6A:
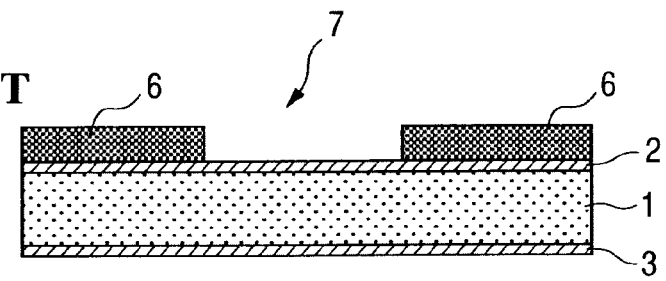
FIGS. 6A, 6B, 6C and 6D are process illustrations showing the manufacturing process of the conventional single-layer plate of an electronic part.
Figure 6B:
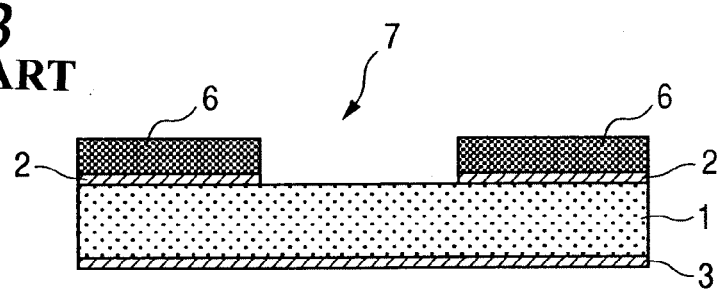
Figure 6C:
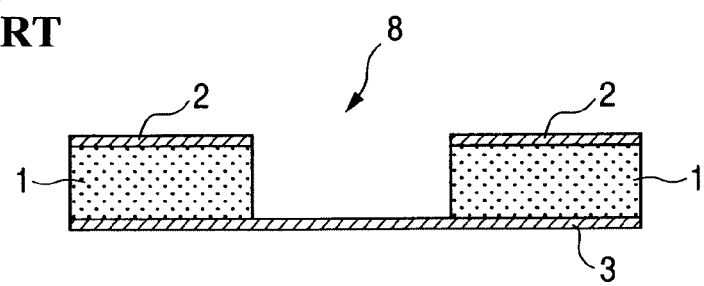
Figure 6D:
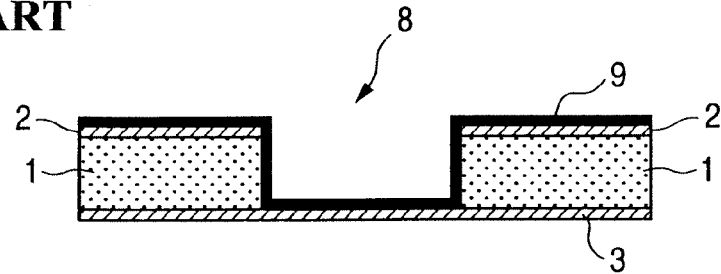
Figure 7A:
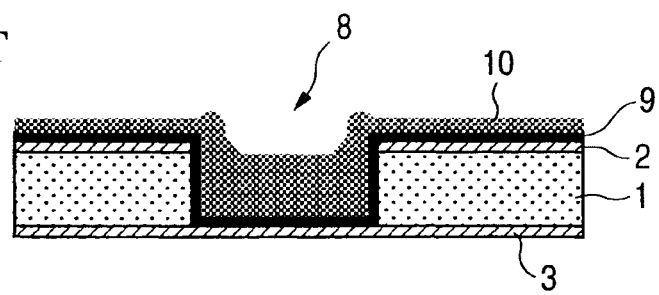
FIGS. 7A, 7B and 7C are process illustrations showing the manufacturing process of the conventional single-layer plate of an electronic part.
Figure 7B:
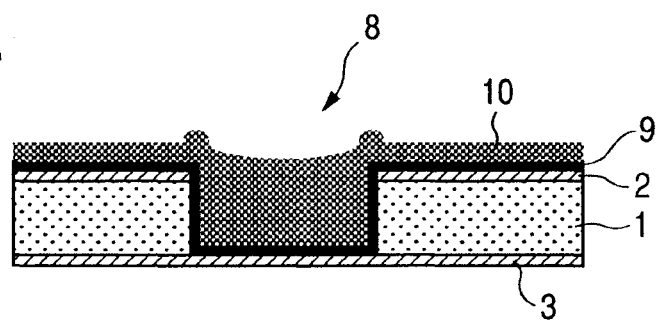
Figure 7C:
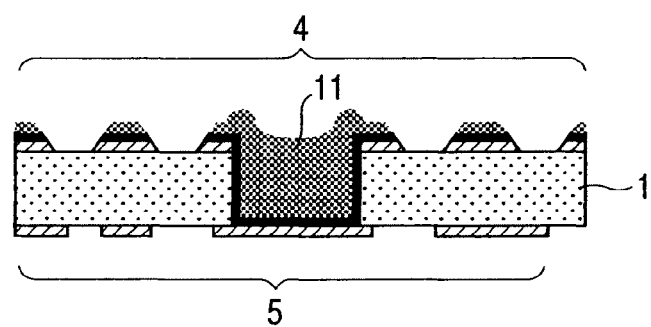

In FIG. 3B, there is shown an example in which the dry film 36 is peeled off, but when as shown, for example, in FIG. 5, in the entire single-layer plate 20, the dry film 36 is smaller than the conductor film 32, this is not restrictive. That is, if the conductor film 32 protrudes beyond a product forming area 46 corresponding to the area of the dry film 36, and is exposed by a sufficient area in a product outside area 48, the stopper action according to the conductor portion 30 is obtained by the conductor film 32 in the product outside area 48 and therefore, the dry film 36 in the product forming area 46 need not be peeled off. In this case, the conductor film 32 in FIGS. 3C and 3D is not plated, and the degree of freedom can be more improved for the formation of the upper wiring pattern 24. Also, it is not restrictive to obtain the stopper action by the conductor film 32 located in the product outside area, but for example, a portion in which the conductor is exposed may be formed in a portion of even a product inside area excluding the opening portion to thereby obtain the stopper action, or the stopper action may be obtained by a combination of the exposed conductors in the product outside area and the product inside area.

If the metal 42 is thus grown in the opening portion 28 with the lower conductor layer 34 as the electric power supplying film, it becomes possible to apply charges even if a plurality of opening portions 28 are formed, and a plurality of conductor portions 30 can be formed. Also, if as described above, the single-layer plate 20 is formed by the use of the manufacturing method according to the present embodiment, an antestep such as electroless plating can be eliminated and therefore, the simplification of the manufacturing process by the elimination of the step becomes possible, and the metal catalyst used for the electroless plating becomes unnecessary, and the reliability of the electronic part can be improved. The conductor portion 30 is sandwiched between the upper wiring pattern 24 and the lower wiring pattern 26 diameter-enlarged from the opening portion 28 and therefore, even if an extraneous force is applied to the single-layer plate 20 itself, the conductor portion 30 can be prevented from coming off from the opening portion 28.

Also, while in the present embodiment, description has been made of the procedure of superposing a plurality of single-layer plates one upon another to thereby form an electronic part, this form is not restrictive, but use may be made, for example, of a form in which what has been described in the present embodiment is applied to a core material, and wiring layers are laminated on the opposite sides of this core material.

While in the present embodiment, for the convenience of construction, mention has been made of the lower conductor layer and the conductor portion overlying this lower conductor layer, this upper and lower positional relationship is not restrictive, but of course, the wiring layer manufactured by the above-described process and an electronic part using the same may be used in such a manner that the conductor portion (the upper conductor layer side) is lower and the lower conductor layer overlies the aforementioned conductor portion.

As described above, according to the present invention, in a method of manufacturing an electronic part in which on that surface of an insulating member sandwiched between conductor film and a lower conductor layer which is adjacent to the conductor film, a conductor portion connected from the lower conductor layer is exposed, an opening portion having the lower conductor layer as a bottom is formed in the formed area of the conductor portion from the conductor film side, metal plating is grown from the bottom of the opening portion with the lower conductor layer as an electrode, and after this metal plating has reached the conductor film to thereby form the conductor portion in the opening portion, metal plating is grown on the upper surfaces of the conductor film and the conductor portion with the conductor film and the conductor portion as electrodes so as to form a thickness enough to form an upper conductor layer and therefore, the electroless plating step heretofore carried out (or other processing step replacing it) can be eliminated and thus, the simplification of the manufacturing process can be achieved and also, it is possible to solve such a problem as a residual metal catalyst, and the degree of unevenness of the height in the thickness direction due to the stopper action and therefore, it becomes possible to improve electrical reliability.

The invention claimed is:

1. A method of manufacturing an electronic part comprising a conductor film, a lower conductor layer, and an insulating member sandwiched between the conductor film and the lower conductor layer, for connecting the conductor film and the lower conductor layer by conductor portions and growing metal plating on the conductor portions and the conductor film, the method comprising:

forming a plurality of opening holes, each having said lower conductor layer as bottoms, through the conductor film and the insulating member from said conductor film side;

growing metal plating layers, as conductor portions from each of the bottoms of said opening holes, from said lower conductor layer as an electrode; and growing the metal plating layers on upper surfaces of said conductor film and said conductor portions with said conductor film and said metal plating layers as electrodes after said conductor portions are formed in the respective plurality of opening holes by growing said metal plating layers so as to contact said metal plating layers with said conductor film located on an upper surface of the insulating member, and to increase area for growing said metal plating layers and reduce current density per unit in said metal plating layers, so as to lower growing speed of said metal plating layers, to thereby form said conductor portions in said opening holes by using the conductor film as a stopper, and forming a thickness enough to form an upper conductor layer, wherein the metal plating layers are grown from each of the bottoms of said opening holes, and on the upper surfaces of said conductor film and said conductor portions, without electroless plating being carried out.

2. A method of manufacturing an electronic part in which on an upper surface of an insulating member covering a lower conductor layer, conductor portions connected from said lower conductor layer are exposed, the method comprising:

forming a conductor film on the upper surface of said insulating member and protective film formed on a part of the upper surface of said insulating member and protective film in a thickness direction, and thereafter forming a plurality of opening holes of which bottom is formed by said lower conductor layer, through said protective film and said conductor film;

growing metal plating layers, as said conductor portions from the bottoms of said plurality of opening holes with said lower conductor layer as an electrode; and growing the metal plating layers on upper surfaces of said conductor film located on an upper surface of the insulating member, and said conductor portions with said conductor film and said metal plating layers on which protective film is not formed as electrodes, to thereby form a thickness enough to form an upper conductor layer after said conductor portions are formed to the substantial same height in the respective plurality of opening holes by growing said metal plating layers so as to contact said metal plating layers with said conductor film, and to increase area for growing said metal plating layers and reduce current density per unit in said metal plating layers, so as to lower growing speed of said metal plating layers, to thereby form said conductor portions in said opening holes by using the conductor film as a stopper, wherein the metal plating layers are grown from each of the bottoms of said opening holes, and on the upper surfaces of said conductor film and said conductor portions, without electroless plating being carried out.

3. A method according to claim 1, wherein said conductor film providing said electrode is set outside a product area.

4. A method according to claim 1, wherein said insulating member and said conductor film are made integral with each other in advance.

5. A method according to claim 2, wherein said exposed conductor film providing said electrode is set outside a product area.

6. A method according to claim 2, wherein said insulating member and said conductor film are made integral with each other in advance.

* * * * *